United States Patent
Pike

(10) Patent No.: US 6,217,936 B1
(45) Date of Patent: Apr. 17, 2001

(54) SEMICONDUCTOR FABRICATION EXTENDED PARTICLE COLLECTION CUP

(75) Inventor: Christopher Lee Pike, Fremont, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/258,834

(22) Filed: Feb. 26, 1999

(51) Int. Cl.[7] .................................................. B05C 13/02
(52) U.S. Cl. ........................................... 427/240; 118/504
(58) Field of Search ............................... 118/50, 52, 56, 118/64, 319, 320, 500, 504, 505; 204/298.11, 298.15; 427/240; 29/25.01

(56) References Cited

U.S. PATENT DOCUMENTS

| | | | |
|---|---|---|---|
| 4,510,176 | * 4/1985 | Cuthbert et al. | 427/82 |
| 5,415,691 | 5/1995 | Fujiyama et al. | 118/52 |
| 5,571,324 | 11/1996 | Sago et al. | 118/320 |
| 5,580,607 | 12/1996 | Takekuma et al. | 427/240 |
| 5,672,205 | 9/1997 | Fujimoto et al. | 118/52 |
| 5,707,687 | 1/1998 | Ueda et al. | 427/240 |
| 5,868,843 | * 2/1999 | Yang et al. | 118/319 |
| 5,940,651 | * 8/1999 | Pike et al. | 396/604 |

\* cited by examiner

*Primary Examiner*—Laura Edwards
(74) *Attorney, Agent, or Firm*—Brinks Hofer Gilson & Lione

(57) ABSTRACT

An improved particle-collecting cup using a fabrication protective device for use in processing semiconductor wafers includes a deflective surface, a protective shield and a protective lip to protect the surface of the semiconductor. The deflective surface encircles the semiconductor and extends both above and below the semiconductor at an inclined angle. The radius of the opening formed by the upper end of the deflective surface is at least as small as the radius of the semiconductor. The protective shield extends downward toward the semiconductor and the protective lip is inclined outward. Any particles spun off from the fluid coating of the semiconductor that may have been reflected are guided away from the surface of the semiconductor by the semiconductor fabrication extended particle collection cup.

12 Claims, 1 Drawing Sheet

SEMICONDUCTOR FABRICATION EXTENDED PARTICLE COLLECTION CUP

BACKGROUND OF THE INVENTION

The present invention relates to a spinner for use during semiconductor device fabrication and, more particularly, to an improved structure of a cup of the spinner for protecting the surface of a semiconductor that has been coated with a liquid from particles spun off of the semiconductor surface from returning to the surface.

During the fabrication of most semiconductor devices, it is necessary to coat the surface of the semiconductor wafer with different fluids, e.g. photoresist or developer. The method of coating the semiconductor wafer typically includes placing the semiconductor wafer on a chuck, fastening the semiconductor wafer to the chuck, spinning the chuck/semiconductor combination at a high speed and then spraying the fluid onto the surface of the semiconductor. The coating is spread out into a relatively even film and the excess is spun off by centrifugal force. This process is commonly known as "spinning on photoresist" or the like in the art.

In the conventional technology, a cup that includes a deflecting surface inclined downward is disposed around the spinner. The cup does not contact the semiconductor or its coating. This deflecting surface is located at the same height as the semiconductor so that most of the excess fluid from the coating, as well as any impurities in the coating, is spun off the semiconductor surface in the form of particles which then impact the cup at the deflecting surface. This surface deflects the particles downward, away from the semiconductor surface and toward a drain. The bottom of the cup typically contains holes for evacuation of any gaseous or particulate matter in the interior of the cup introduced during processing.

The problem in the conventional spinner described above is that, at the spin speeds necessary for processing, while most of the particles are spun off the semiconductor radially and deflected downward, a significant number will be lifted aerodynamically. These particles may reflect back on to the surface of the semiconductor instead of being deflected toward the drain. The particles that return to the surface of the semiconductor surface create unevenness in the thickness of the film, filaments in the film or resist balls, and are thus typically a source of defects brought about during the photolithographic process. Consequently, the present art requires a structure to eliminate the reflected particles and accordingly, the source of these defects. Because the production of semiconductor devices from a semiconductor wafer depends critically on the parameters used in the necessary photolithographic processes, any irregularity in the coating creates defects. These defects in turn result in a decrease in the yield of devices created from these semiconductor wafers.

SUMMARY OF THE INVENTION

In view of the above, the present invention comprises a semiconductor fabrication extended particle collection cup and method for protecting a rotating semiconductor surface coated with a fluid from particles that have been spun off from the surface.

Specifically, the semiconductor fabrication extended particle collection cup of the present invention comprises a particle-collecting cup extending upward substantially linearly from a base to define a perimeter. The particle-collecting cup is operative to receive the semiconductor wafer. An inclined deflecting surface extending upwardly and radially inwardly from the perimeter of the particle-collecting cup is also provided. This inclined deflecting surface has an upper edge and a lower edge in which the lower edge is integrally coupled to the perimeter of the particle-collecting cup and the upper edge defines an opening having a diameter no greater than the surface of the semiconductor wafer.

In a preferred structure according to the invention, the semiconductor fabrication extended particle collection cup further comprises a protective shield extending downward toward the semiconductor wafer. This shield has an upper edge and a lower edge in which the upper edge is integrally connected with the upper edge of the deflective surface.

In another preferred structure according to the invention, the semiconductor fabrication extended particle collection cup further comprises an inclined protective lip having an inner edge and an outer edge in which the inner edge is integrally connected with the lower edge of the protective shield. In addition, the protective lip is inclined so as to increase the radius of the protective lip as measured from the inner edge to the outer edge.

In another aspect of the invention, a method for protecting a rotating semiconductor surface coated with a fluid from particles that have been spun off from the surface is provided. This method comprises the initial step of providing a deflecting surface, a protective shield and a protective lip external to the semiconductor towards which said particles are projected. Subsequent steps comprise deflecting the particles that impact with the deflecting surface away from the semiconductor surface and shielding the semiconductor surface from at least some of the particles being projected back to said semiconductor surface.

In another preferred aspect of the invention, the method further comprises the step of determining the minimum angle of deflection for particles impinging on the inclined surface so as to return to the semiconductor surface.

In another preferred aspect of the invention, the method further comprises the step of protecting the semiconductor surface by directing the reflected particles into the enclosure formed by the deflecting surface, the protective surface, and the protective lip. The particles directed into the enclosure may then be channeled away from the semiconductor surface.

It is therefore a primary object of the present invention to prevent the excess particles spun off the surface of the semiconductor from returning to the semiconductor by use of the semiconductor fabrication extended particle collection cup.

The present invention will become more apparent from the description of the preferred embodiments set forth below with reference to the accompanying drawings.

DETAILED DESCRIPTION OF THE PRESENTLY PREFERRED EMBODIMENTS OF THE INVENTION

Figure 1:
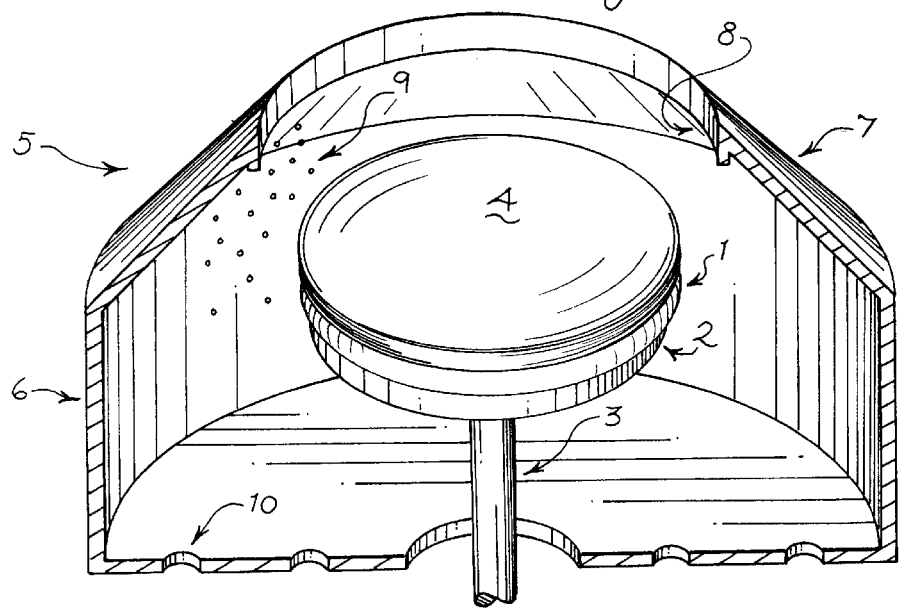
FIG. 1 shows a cross-sectional view of a conventional cup/spinner combination of the prior art.

Referring to the drawings, where like reference numerals refer to like elements throughout, FIG. 1 shows a cross-sectional view of a prior art. As shown in FIG. 1, a semiconductor wafer 1 is disposed on a chuck 2, which is connected to a rotatable cylindrical base 3. A fluid coating 4, such as photoresist or developer, is typically present on the semiconductor wafer 1 during processing. A particle-collecting cup 5 surrounds the entire structure. The particle-collecting cup 5 consists of a base 6 and a deflecting surface 7 and may contain a lip 8. The deflecting surface 7 extends from below the chuck 2 to above the plane of the fluid coating 3. The lip, if present, 8 extends slightly downward, toward the fluid coating 4. Both the deflecting surface 7 and the lip 8 are located such that the minimum radius of either construct is sufficiently larger than the radius of the semiconductor wafer 1. This is done so that during routine processing the semiconductor wafer 1 is easily accessible. Using the apparatus of FIG. 1, therefore, liquid that is spun off of the fluid coating 4 in the form of particles 9 strikes the deflecting surface 7 and is either deflected toward a drain 10 in the base 6 or reflected backwards toward the semiconductor wafer 1.

Figure 2:
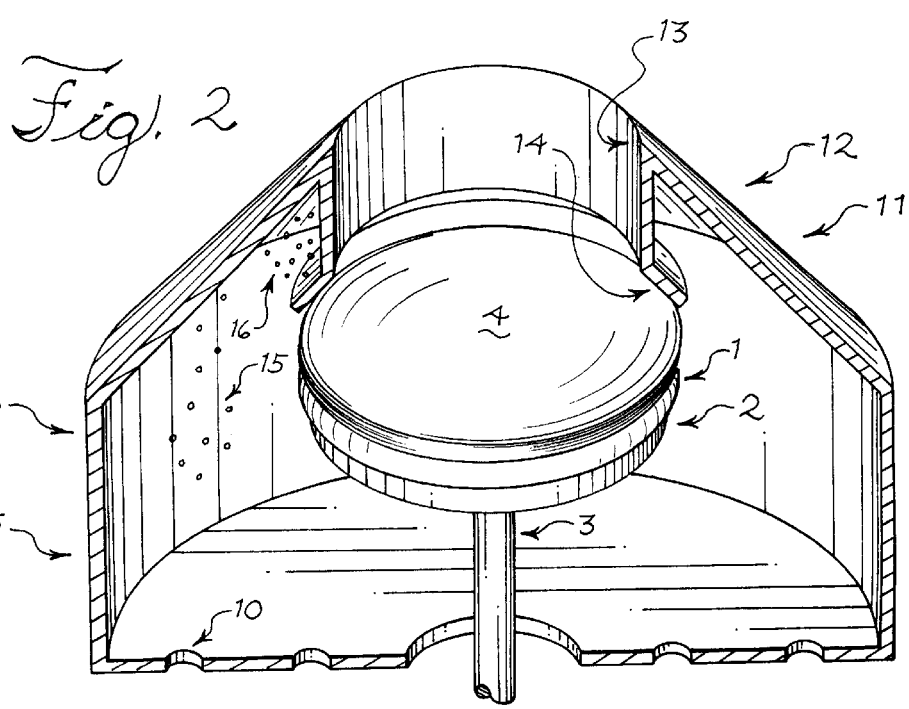
FIG. 2 depicts a cross-sectional view of the improved cup/spinner combination featuring a semiconductor fabrication extended particle collection cup in accordance with the present invention.

A cross-sectional area of the primary embodiment of the invention is shown in FIG. 2. In this figure a semiconductor wafer 1 is located on a chuck 2, which is connected to a rotatable cylindrical base 3. A fluid coating 4, such as photoresist or developer, is present on the semiconductor wafer 1. A particle-collecting cup 5 surrounds the entire structure. The particle-collecting cup 5 may be formed from a plurality of wedge-like pieces (not shown) so that it is manually separable. The entire particle-collecting cup 5 consists of a base 6 and a semiconductor fabrication extended particle collection cup 11. The semiconductor fabrication extended particle collection cup 11 consists of a deflective surface 12, a protective shield 13 and a protective lip 14.

As shown in FIG. 2, the deflective surface 12 is a surface inclined toward the semiconductor wafer 1 whose primary purpose is to guide particles spun off of the fluid coating 4, i.e. the deflected particles 15, toward the base of the particle-collecting cup 6 and a drain 10. To this end, one edge of the deflective surface 12 is positioned below the semiconductor wafer 1 and the other end is situated above the semiconductor wafer 1. Unlike the prior art shown in FIG. 1, the end of this deflective surface is positioned such that it is directly above the semiconductor wafer 1. Correspondingly, the radius of the hole formed by the end of the deflective surface 12 is smaller than or equal to the radius of the semiconductor wafer 1.

The protective shield 13 extends radially downward toward the semiconductor wafer 1, and the protective lip 14 extends from the end of the protective shield 13. The protective lip 14 in FIG. 2 is preferably inclined outward and downward toward the edge of the semiconductor wafer 1. As shown in FIG. 2, at no location does any part of the particle-collecting cup of the present invention contact the chuck 2, the semiconductor wafer 1 or the fluid coating 4.

In the preferred embodiment of the invention, the protective lip 14 in FIG. 2 is inclined at an acute angle, as measured between the end of the protecting surface and the horizontal plane parallel with the semiconductor wafer 1. However, in an alternate embodiment of the present invention, the protective lip 14 may be inclined exactly parallel with the semiconductor wafer 1, i.e. horizontal. The radius of the hole formed by the edge of the protective lip 14 is also preferably larger than the radius of the semiconductor wafer 1 in the preferred embodiment. In an alternate embodiment, this radius may be equal to or slightly less than the radius of the semiconductor wafer 1 without loss of the benefits of the present invention.

In the preceding description, the structure of the entire particle-collecting cup has been described such that transfer of the semiconductor wafer 1 to and from the chuck 2 is difficult, at best. Although outside the scope of the present invention, it is noted that to enable the use of this invention, some method must be undertaken to effect this transfer. One method to alleviate this problem has already been indicated above. As stated, in the preferred embodiment the entire particle-collecting cup is composed of a plurality of pieces. These pieces may be mechanically separated to allow transfer of the semiconductor wafer to and from the chuck. Another solution to this problem is to make the entire particle-collecting cup two pieces, the base of the particle-collecting cup and the semiconductor fabrication extended particle collection cup, which are physically separable. The foregoing solutions are not intended to be the sole solutions to this problem; other solutions designed by persons skilled in the art may exist without departing from the spirit of the present invention.

The advantage gained by using the present invention is that particles reflected towards the semiconductor wafer 1, i.e. the reflected particles 16, are captured by the semiconductor fabrication extended particle collection cup 11 and are no longer free to return to the fluid coating 4. The semiconductor fabrication extended particle collection cup 11 restricts the movement of the reflected particles 16 such that they are now directed outward toward the base of the particle-collecting cup 6 similar to the deflected particles 15. These reflected particles 16 thus no longer become the source of the defects as cited above.

Although various embodiments that incorporate the teachings of the present invention have been shown and described in detail herein, those skilled in the art can readily devise many other varied embodiments that still incorporate these teachings.

What is claimed is:

1. A method for protecting a rotating semiconductor surface coated with a fluid from particles that have been spun off from said surface, comprising:

providing a deflecting surface comprising an inclined surface, a protective shield and a protective lip external to said semiconductor towards which said particles are projected;

deflecting said particles that impact with the deflecting surface away from said semiconductor surface; and shielding said semiconductor surface from at least some of said particles being projected back to said semiconductor surface.

2. The method of claim 1, further comprising determining the minimum angle of deflection for particles impinging on said inclined surface to return to said semiconductor surface.

3. The method of claim 2, further comprising protecting said semiconductor surface by directing said deflected particles into an enclosure formed by said deflecting surface, said protective shield, and said protective lip wherein said particles may be channeled away from said semiconductor surface.

4. A semiconductor fabrication extended particle collection cup for protecting a rotating semiconductor wafer retaining a fluid coating on the wafer surface comprising:

a particle-collecting cup extending upward substantially linearly from a base to define a perimeter, said particle-collecting cup operative to receive said semiconductor wafer;

an inclined deflecting surface extending upwardly and radially inwardly from said perimeter of said particle-collecting cup, said inclined deflecting surface having an upper edge and a lower edge, said lower edge coupled to said perimeter of said particle-collecting cup, said upper edge defining an opening having a diameter no greater than the surface of said semiconductor wafers a protective shield extending downward toward said semiconductor wafer and having an upper edge and a lower edge, said upper edge integrally connected with said upper edge of said deflective surface; and an inclined protective lip having an inner edge and an outer edge, said inner edge integrally connected with said lower edge of said protective shield wherein said protective lip is inclined so as to increase the radius of said protective lip as measured from said inner edge to said outer edge.

5. A semiconductor fabrication extended particle collection cup according to claim 4, wherein no part of said semiconductor fabrication extended particle collection cup contacts said semiconductor wafer and said fluid coating.

6. A semiconductor fabrication extended particle collection cup according to claim 5, further comprising:

a chuck;

a rotatable cylindrical shaft connected to a center of said chuck;

means for rotating said chuck; and a plurality of holes located in said chuck means for retaining a semiconductor on said chuck by air evacuation.

7. A semiconductor fabrication extended particle collection cup according to claim 6, further comprising holes disposed in the base of said particle-collecting cup for one of liquid and gaseous evacuation.

8. A semiconductor fabrication extended particle collection cup according to claim 7, said semiconductor fabrication extended particle-collecting cup comprising a plurality of pieces, said pieces separable such that said semiconductor may be accepted by said chuck without contacting any part of said semiconductor fabrication extended particle collection cup.

9. A semiconductor fabrication extended particle collection cup according to claim 8, said base separable from said semiconductor fabrication extended particle-collecting cup.

10. A semiconductor fabrication extended particle collection cup according to claim 4, said semiconductor fabrication extended particle-collecting cup comprising a plurality of pieces, said pieces separable such that said semiconductor may be accepted by said chuck without contacting any part of said semiconductor fabrication extended particle collection cup.

11. A semiconductor fabrication extended particle collection cup according to claim 10, said base separable from said semiconductor fabrication extended particle-collecting cup.

12. A semiconductor fabrication extended particle collection cup according to claim 4, said base separable from said semiconductor fabrication extended particle-collecting cup.

\* \* \* \* \*

UNITED STATES PATENT AND TRADEMARK OFFICE
CERTIFICATE OF CORRECTION

PATENT NO. : 6,217,936 B1
DATED : April 17, 2001
INVENTOR(S) : Christopher Lee Pike It is certified that error appears in the above-identified patent and that said Letters Patent is hereby corrected as shown below:

Column 5,
Line 6, please delete the letter "s" after the word wafers and replace it with a -- ; --.

Signed and Sealed this

Sixteenth Day of October, 2001

Attest:

NICHOLAS P. GODICI
Attesting Officer   Acting Director of the United States Patent and Trademark Office